United States Patent [19]

Inoue et al.

[11] Patent Number: 4,775,878

[45] Date of Patent: Oct. 4, 1988

[54] SEMICONDUCTOR DEVICE FORMED IN SEMI-INSULATIVE SUBSTRATE

[75] Inventors: Kazuhiko Inoue; Yutaka Tomisawa, both of Yokohama, Japan

[73] Assignee: Kabushiki Kaisha Toshiba, Kawasaki, Japan

[21] Appl. No.: 60,341

[22] Filed: Jun. 10, 1987

[30] Foreign Application Priority Data

Sep. 30, 1986 [JP] Japan ................. 61-231722

[51] Int. Cl.$^4$ .......................................... H01L 29/80
[52] U.S. Cl. ........................................ 357/22; 357/15
[58] Field of Search ............... 357/23.2, 23.14, 22 R, 357/15, 22 I, 22 S

[56] References Cited

U.S. PATENT DOCUMENTS 4,633,282 12/1986 Lee ........................... 357/22 I

FOREIGN PATENT DOCUMENTS 58-148457 9/1983 Japan ........................... 357/23.2
60-121775 6/1985 Japan ............................. 357/22
6197871 5/1986 Japan ............................. 357/22

Primary Examiner—Andrew J. James
Assistant Examiner—Mark Prenty
Attorney, Agent, or Firm—Finnegan, Henderson Farabow, Garrett and Dunner

[57] ABSTRACT

Disclosed is a semiconductor device having a field effect transistor (FET) formed in a semi-insulative substrate. A positive bias voltage equal to or higher than the bias voltage applied to the drain electrode of the FET is applied to a back surface electrode formed on the back surface of the substrate, with the result that the electrons generated within the semi-insulative substrate are pulled into the back surface electrode so as to prevent said electrons from flowing into the drain region and, thus, to prevent the drain current vibration.

2 Claims, 4 Drawing Sheets

SEMICONDUCTOR DEVICE FORMED IN SEMI-INSULATIVE SUBSTRATE

BACKGROUND OF THE INVENTION

The present invention relates to a semiconductor device formed in a semi-insulative substrate.

A pellet having an FET (field effect transistor) formed in, for example, a GaAs substrate is generally sealed in a casing as shown in FIG. 1. As seen from the drawing, a pellet 11 comprising a source electrode 15, a drain electrode 16 and a gate electrode 17 is mounted on a mount portion 12a of a source lead 12. Also, a drain lead 13 and a gate lead 14 are arranged apart from the mount portion 12a in a direction perpendicular to the extending direction of the source lead 12. Further, bonding wires 18, 19, 20 are provided to connect the source electrode 15, drain electrode 16 and gate electrode 17 to the source lead 12, drain lead 13 and gate lead 14, respectively. It is seen that the pellet 11, mount portion 12a and the end portions of the source lead 12, drain lead 13, gate lead 14 are sealed in the casing 21. The particular construction is thought optimum for shortening and widening the source lead 12 and for shortening the bonding wire 18 connecting the source electrode 15 of the pellet 11 to the source lead 12.

The particular sealing shown in FIG. 1 makes it possible to diminish the inductance Ls of the source lead 12. It is also possible to diminish the capacitance Cgd between the gate lead 14 and the drain lead 13 because the source lead 12 is interposed between the gate lead 14 and the drain lead 13. What should be noted is that the diminished inductance Ls and capacitance Cgd permit increasing the maximum available gain MAG of the FET. Specifically, the maximum effective gain MAG of the FET is represented as follows:

$$MAG = (f_T/f)^2/[4\ gds(Rg + Ri + Rs + \pi f_T LS) + 4\pi f_T Cgd(2Rg + Ri + Rs + 2\pi f_T LS)]$$

where, "$f_T$" denotes the cut-off frequency, "f" the operating frequency, "gds" the source-drain conductance, "Rg" the gate resistance, "Ri" the resistance of the channel right under the gate, and "Rs" the source resistance.

As apparent from the formula given above, the maximum available gain MAG is increased, if the source lead inductance Ls and/or the gate-drain capacitance Cgd are diminished.

FIG. 2 is a cross sectional view showing the construction of the pellet 11. It is seen that an N+ source region 23 and an N+ drain region 24 are formed in a semi-insulative GaAs substrate 22, with a channel region 25 being formed between the source and drain regions 23 and 24. Also, a source electrode 26, a drain electrode 27 and a gate electrode 28 are formed on the source region 23, drain region 24 and channel region 25, respectively. Further, a back electrode 29 is formed on the back surface of the substrate 22. The symbols $I_D$ and $I_{EX}$ shown in FIG. 2 denote the drain current (operating current) and excess leak current, respectively. To facilitate the description, the flow direction of current is shown equal to the flow direction of electrons. It should be noted that a shaded region 30 denotes a depletion layer extending downward from the gate electrode 28.

When the pellet 11 of the construction shown in FIG. 2 is mounted as shown in FIG. 1, the drain current $I_D$ is vibrated upon application of a DC bias between the source and drain regions 23 and 24. Originally, the drain current $I_D$ alone acts as the operating current of the FET. However, the excess leak current $I_{EX}$ flowing through the semi-insulative substrate 22 is thought to bring about vibration of the drain current $I_D$ because the excess leak current $I_{EX}$ contains AC components of about 10 to 100 Hz. It has been confirmed that generation and extinction of electrons take place within the semi-insulative GaAs substrate, giving rise to the AC components contained in the excess leak current $I_{EX}$.

Since the potential of the source region 23 is higher than that of the drain region 24, the electrons E generated within the semi-insulative GaAs substrate flow as the excess leak current $I_{EX}$ into the drain region 24 through the depletion layer 31 formed in the lower portion of the FET operating region, as shown in FIG. 3. Flow of the electrons E through the depletion layer 31 causes a change in the width of the depletion layer, leading to a change in the width of the channel region. The change in the width of the channel region is thought to modulate the drain current $I_D$, leading to vibration of the current flowing out of the drain electrode 27. Incidentally, vibration of current within a semi-insulative substrate is described in "Applied Physics Letter, 41 (10), Nov. 15, 1982 P. 989" and "1985 IEEE GaAs IC Symposium 'Low Frequency Oscillation in GaAs IC's'".

Vibration of the drain current $I_D$ brings about vibration of the high frequency gain Gps, leading to vibration of the total gain of the equipment having the FET element included in its electric circuit. When it comes to, for example, a TV tuner having the FET element incorporated therein, the TV screen is caused to flicker.

SUMMARY OF THE INVENTION

The present invention is intended to provide a semiconductor device formed in a semi-insulative substrate and capable of preventing the drain current vibration.

According to the present invention, there is provided a semiconductor device, comprising:
 a semi-insulative substrate;
 a field effect transistor formed in the surface region of the substrate; and
 a back surface electrode formed on the back surface of the substrate and applied with a bias voltage equal to or higher than the bias voltage applied to the drain electrode of the field effect transistor.

The electrons generated within the semi-insulative substrate are released to the outside through the back surface electrode so as to prevent said electrons from flowing into the drain region of the field effect transistor and, thus, to prevent the drain current vibration.

DESCRIPTION OF THE PREFERRED EMBODIMENTS

Figure 1:
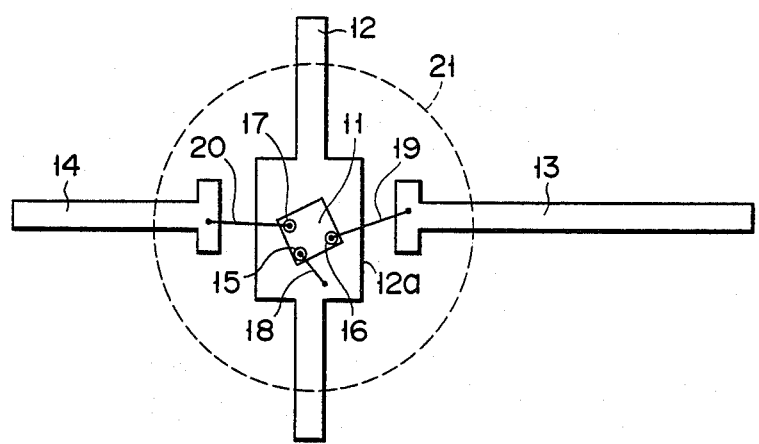
FIG. 1 is a plan view showing that a pellet of a conventional FET formed in a semi-insulative substrate is sealed in a casing.
Figure 2:
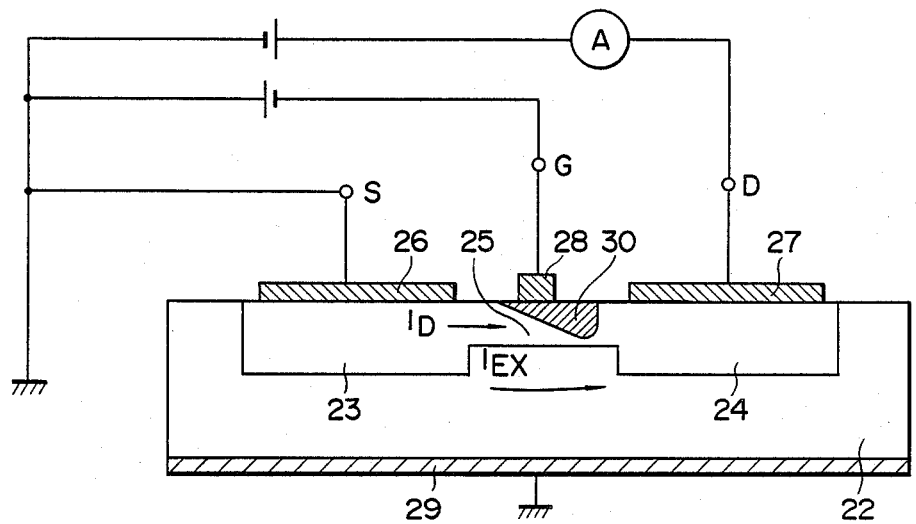
FIG. 2 is a cross sectional view showing the construction of the FET shown in FIG. 1.
Figure 3:
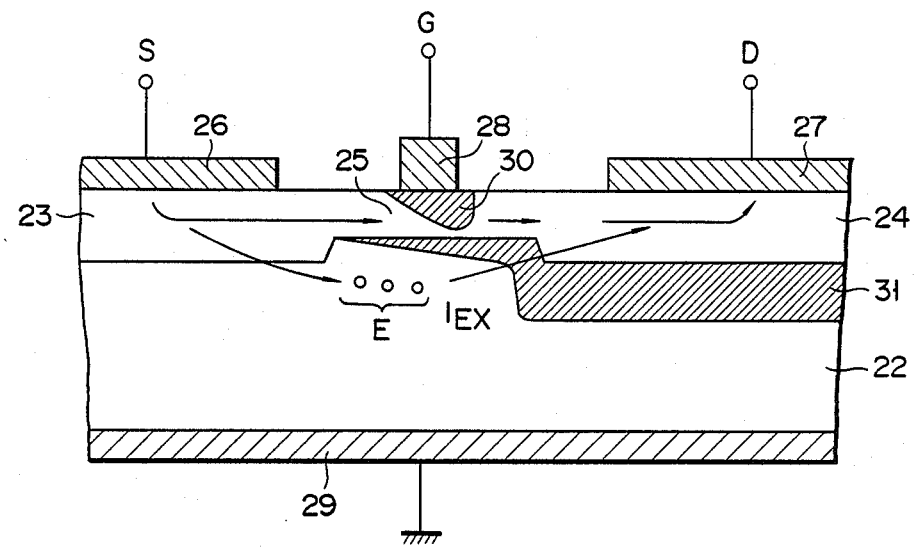
FIG. 3 is a cross sectional view schematically showing how an excess leak current $I_{EX}$ flows into the drain region in the conventional FET formed in a semi-insulative substrate.
Figure 4:
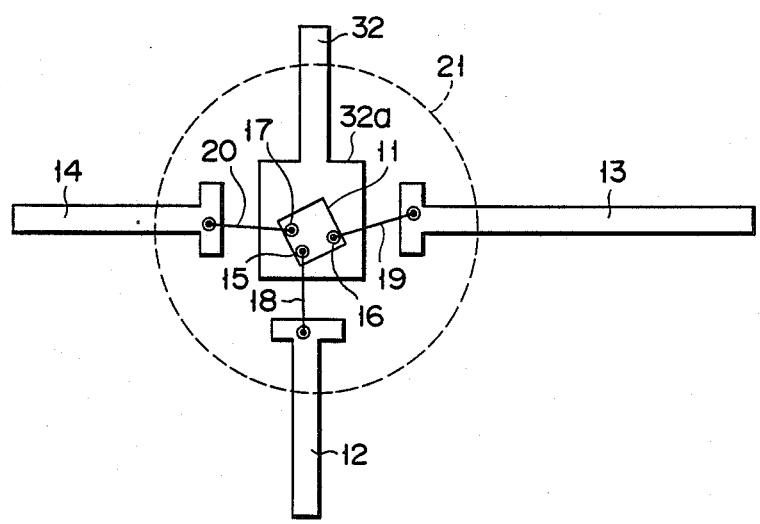
FIG. 4 is a plan view showing that a pellet of an FET formed in a semi-insulative substrate according to one embodiment of the present invention is sealed in a casing.
Figure 5:
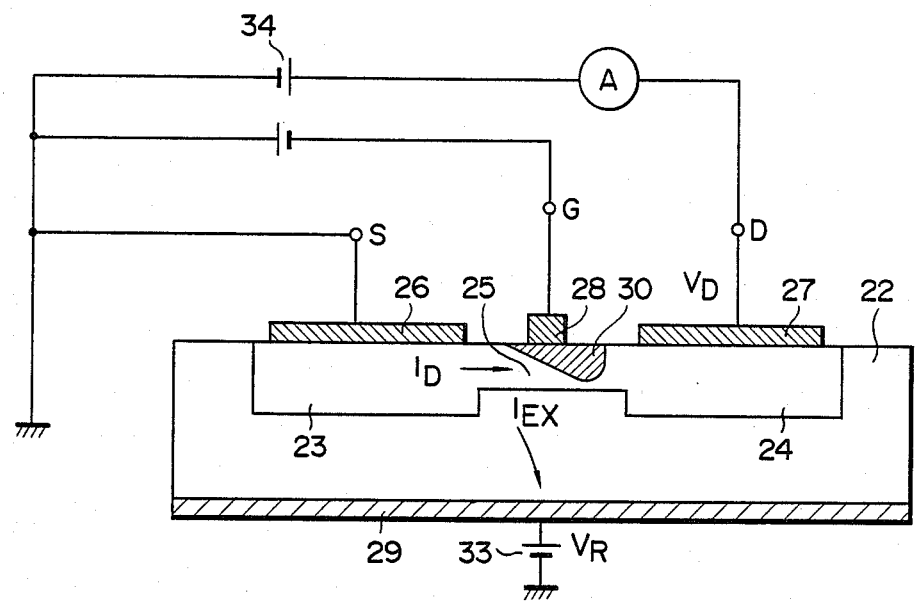
FIG. 5 is a cross sectional view showing the construction of the FET shown in FIG. 4.
Figure 6:
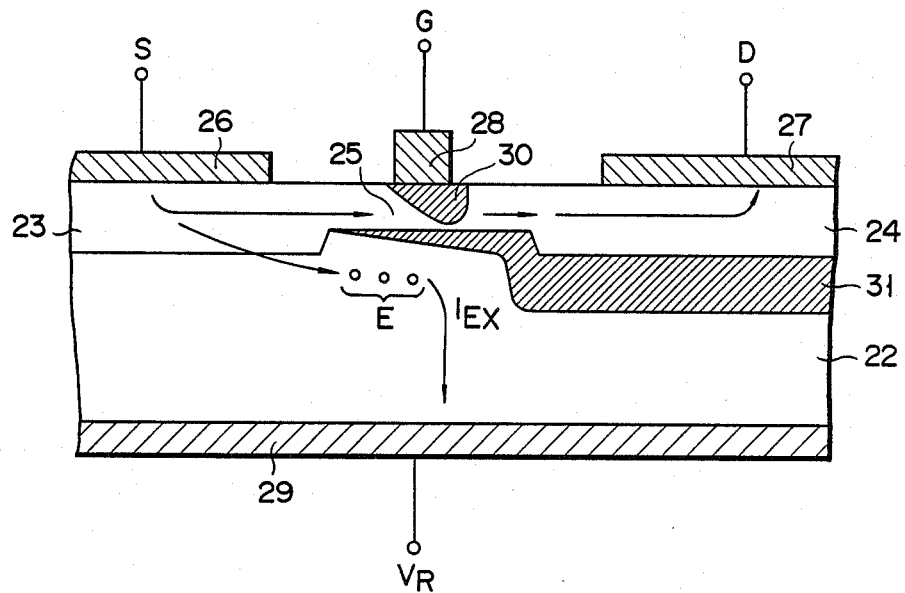
FIG. 6. is a cross sectional view showing the flow of the drain current and excess leak current in the FET of the present invention formed in a semi-insulative substrate.

FIGS. 4-6 collectively show a semiconductor device according to one embodiment of the present invention. The constituents of the semiconductor device which are the same as those shown in FIGS. 1-3 are denoted by the same reference numerals in FIGS. 4-6. As seen from FIG. 4, the pellet 11 having an FET formed therein is mounted on a mount portion 32a of a lead 32. A positive bias voltage VR higher than the drain bias voltage is applied to the lead 32. It is seen that the source lead 12 aligned with the lead 32 is disposed apart from the mount portion 32a. The drain lead 13 and the gate lead 14 aligned with the drain lead 13 with the mount portion 32a interposed therebetween are disposed in the direction perpendicular to the extending direction of the source lead 12. It is seen that the leads 13 and 14 are disposed apart from the mount portion 32a. The source electrode 15, drain electrode 16 and gate electrode 17 of the pellet 11 are connected to the source lead 12, drain lead 13 and gate lead 14 via the bonding wires 18, 19, 20, respectively. As seen from the drawing, the pellet 11, mount portion 32a, and the end portions of the lead 32, source lead 12, drain lead 13 and gate lead 14 are sealed in the casing 21.

FIG. 5 is a cross sectional view of the pellet 11 included in FIG. 4. It is seen that the back surface electrode 29 is formed on the back surface of the semi-insulative substrate 22. A positive bias voltage VR is applied from a power source 33 to the back surface electrode 29 via the lead 32 shown in FIG. 4. It is important to note that the bias voltage VR is set equal to or higher than the drain bias voltage VD applied from a drain bias power source 34 to the drain electrode 27 (VR≧VD). Since the positive bias voltage VR not lower than the voltage VD is applied to the back surface electrode 29, the electrons generated within the semi-insulative substrate 22 are pulled into the back surface electrode 29. It follows that the excess leak current $I_{EX}$ flows into the back surface electrode 29. Naturally, the excess leak current $I_{EX}$ does not flow through the depletion layer 31 formed in the lower portion of the FET operating region, making it possible to prevent the widths of the depletion layer 31 and the channel region from being changed. Of course, the drain current ID is not modulated, with the result that the current flowing out of the drain electrode 27 is not vibrated.

Figure 7:
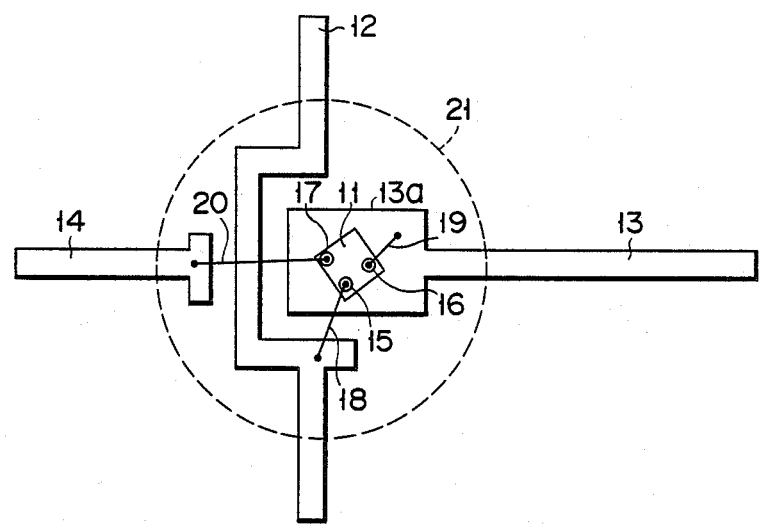
FIG. 7 is a plan view showing that a pellet of an FET formed in a semi-insulative substrate according to another embodiment of the present invention is sealed in a casing.
Figure 8:
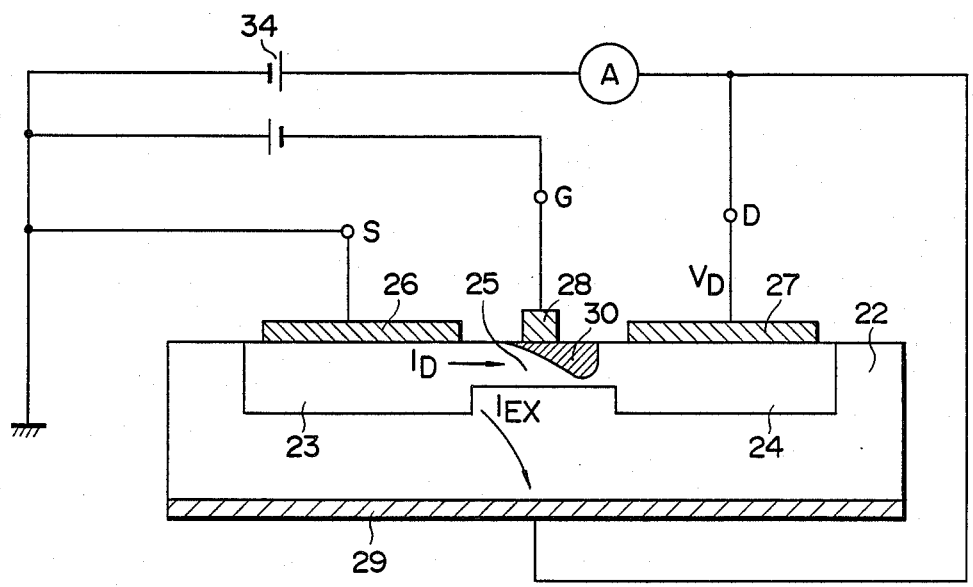
FIG. 8 is a cross sectional view showing the construction of the FET shown in FIG. 7.

FIGS. 7 and 8 collectively show a semiconductor device according to another embodiment of the present invention. The reference numerals common with FIGS. 4-6 and FIGS. 7, 8 denote the same constituents of the device. In the embodiment shown in FIGS. 7 and 8, the source lead 12 is shaped to partly surround a mount portion 13a formed at the edge of the drain lead 13 such that the source lead 12 is spaced from and interposed between the drain and gate electrodes 13 and 14. As a result, it is possible to maintain the conventional level of the capacitance Cgd between the gate electrode 14 and the drain electrode 13. Also, the pellet 11 having an FET formed in the semi-insulative substrate 22 is mounted on the mount portion 13a of the drain lead 13 so as to apply the drain bias voltage VD to the back surface electrode 29, as seen from the drawings. As apparent from the drawings, the particular construction permits minimizing the increase in the inductance Ls of the source lead 12. Of course, the excess leak current $I_{EX}$ caused by the electrons generated within the semi-insulative substrate 22 are pulled into the back surface electrode 29 so as to prevent the vibration of the drain current ID.

What is claimed is:

1. A semiconductor device, comprising:
a semi-insulative substrate having a front surface region and a back surface opposite the front surface region;
a field effect transistor having a gate electrode, a source electrode and a drain electrode formed in the front surface region of said substrate; and
an electrode formed on said back surface of said substrate, means connecting a bias voltage to said drain electrode, and means connecting said back surface electrode to a bias voltage equal to or higher than the bias voltage connected to said drain electrode of the field effect transistor for preventing electrons formed within said substrate from flowing into the drain region of said transistor.

2. The semiconductor device according to claim 1, wherein the semi-insulative substrate is formed of GaAs.

* * * * *